US008247782B2

(12) United States Patent
Edinger et al.

(10) Patent No.: US 8,247,782 B2
(45) Date of Patent: Aug. 21, 2012

(54) APPARATUS AND METHOD FOR INVESTIGATING AND/OR MODIFYING A SAMPLE

(75) Inventors: Klaus Edinger, Lorsch (DE); Rainer Becker, Pfungstadt (DE); Michael Budach, Hanau (DE); Thorsten Hofmann, Rodgau (DE)

(73) Assignee: Carl Zeiss SMS GmbH, Jena (DE)

( * ) Notice: Subject to any disclaimer, the term of this patent is extended or adjusted under 35 U.S.C. 154(b) by 166 days.

(21) Appl. No.: 12/745,059

(22) Filed: May 27, 2010

(65) Prior Publication Data

US 2011/0210181 A1    Sep. 1, 2011

Related U.S. Application Data

(63) Continuation of application No. PCT/EP2008/068220, filed on Dec. 23, 2008.

(60) Provisional application No. 61/016,724, filed on Dec. 26, 2007.

(51) Int. Cl.
*H01J 49/22* (2006.01)
*G21K 5/02* (2006.01)

(52) U.S. Cl. .......... 250/396 R; 250/306; 250/307; 250/310; 250/492.2; 250/492.22

(58) Field of Classification Search ........... 250/396 R, 250/306, 307, 310, 492.2, 492.22
See application file for complete search history.

(56) References Cited

U.S. PATENT DOCUMENTS

| 5,600,146 | A | 2/1997 | Felker et al. |
|---|---|---|---|
| 5,683,547 | A | 11/1997 | Azuma et al. |
| 6,182,605 | B1 | 2/2001 | Frosien |
| 6,322,672 | B1 | 11/2001 | Shuman et al. |
| 6,365,905 | B1 | 4/2002 | Koyama et al. |
| 6,407,001 | B1 | 6/2002 | Scott |
| 6,489,610 | B1 | 12/2002 | Barofsky et al. |
| 6,509,276 | B2 | 1/2003 | Scott |
| 6,514,866 | B2 | 2/2003 | Russell et al. |
| 6,580,072 | B1 | 6/2003 | Chang et al. |
| 6,787,772 | B2 | 9/2004 | Ose et al. |

(Continued)

FOREIGN PATENT DOCUMENTS

DE    69 608 219 T2    9/2000

(Continued)

OTHER PUBLICATIONS

Bonnai et al., Nuclear Instruments and Methods, vol. 157 (1), Nov. 1978, p. 55-63.

(Continued)

*Primary Examiner* — Nikita Wells
(74) *Attorney, Agent, or Firm* — Fish & Richardson P.C.

(57) ABSTRACT

An apparatus and a method for investigating and/or modifying a sample is disclosed. The apparatus comprises a charged particle source, at least one particle optical element forming a charged particle beam of charged particles emitted by said charged particle source. The apparatus further comprises an objective lens which generates a charged particle probe from said charged particle beam. The objective lens defines a particle optical axis. A first electrostatic deflection element is arranged—in a direction of propagation of charged particles emitted by said charged particle source—downstream of the objective lens. The electrostatic deflection element deflecting the charged particle beam in a direction perpendicular to said charged particle optical axis and has a deflection bandwidth of at least 10 MHz.

20 Claims, 13 Drawing Sheets

U.S. PATENT DOCUMENTS

Figure 1:
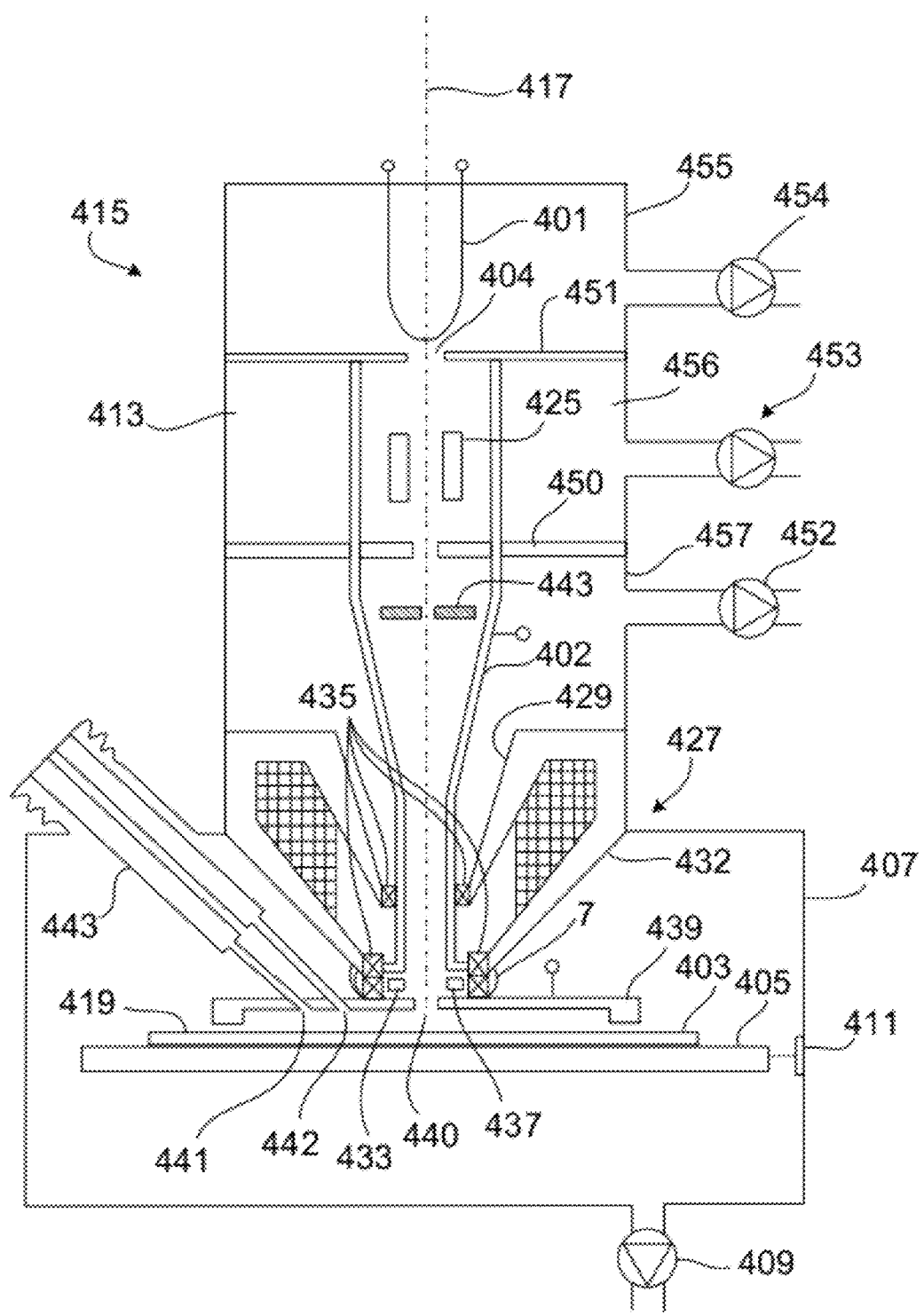

| | | | |
|---|---|---|---|
| 6,787,783 | B2 | 9/2004 | Marchman et al. |
| 6,797,953 | B2 | 9/2004 | Gerlach et al. |
| 6,824,655 | B2 | 11/2004 | Makarov et al. |
| 6,863,787 | B2 | 3/2005 | Huynh et al. |
| 6,864,482 | B2 | 3/2005 | Sato et al. |
| 6,900,137 | B2 | 5/2005 | Herschbein et al. |
| 7,029,595 | B1 | 4/2006 | Li et al. |
| 7,148,073 | B1 | 12/2006 | Soltz et al. |
| 7,232,997 | B2 * | 6/2007 | Edinger et al. ............. 250/311 |
| 7,439,504 | B2 * | 10/2008 | Hiroi et al. ............... 250/310 |
| 7,462,848 | B2 * | 12/2008 | Parker ................. 250/492.23 |
| 7,569,841 | B2 * | 8/2009 | Hill et al. ............ 250/492.22 |
| 7,932,495 | B2 * | 4/2011 | Adamec ................... 250/307 |
| 2004/0043621 | A1 | 3/2004 | Nasser-Ghodsi |
| 2004/0056249 | A1 | 3/2004 | Russell et al. |
| 2006/0060790 | A1 | 3/2006 | Nakasuji et al. |
| 2007/0138388 | A1 | 6/2007 | Ward et al. |

FOREIGN PATENT DOCUMENTS

| | | |
|---|---|---|
| DE | 102 08 043 | 9/2001 |
| DE | 101 22 957 | 11/2002 |
| DE | 69 633 505 T2 | 3/2005 |
| EP | 1 411 538 | 4/2004 |
| EP | 1 465 243 | 10/2004 |
| EP | 1 703 537 | 9/2006 |
| EP | 1 710 327 | 10/2006 |
| JP | 2004-312017 | 11/2004 |
| WO | WO 01/067502 | 9/2001 |
| WO | WO 03/019629 | 3/2003 |

OTHER PUBLICATIONS

Casey et al., Journal of Vacuum Science and Technology B 20 (2002) 2682.

Edinger et al., "Modelling of focused ion beam induced surface chemistry," J. Vac. Sci. Technol. B 18, 3190 (2000).

Edinger, Journal of Vacuum Science and Technology B 17 (1999) 3058.

Gonzalez et al., Journal of Vacuum Science and Technology B 19 (2001) 2539.

Gonzalez et al., Journal of Vacuum Science and Technology B 20 (2002) 2700.

Harriott, "Focused Ion Beam XeF2 etching of materials for phase shift masks," J. Vac. Sci. Technol. B 11, 2200 (1993).

Koops et al., "Characterization and application of materials grown by electron-beam-induced deposition," Jpn. J. Appl. Phys., Part 1 33(12), 7099 (1994).

Koops et al., "Three-dimensional additive electron-beam lithography," SPIE vol. 2780 p. 388.

Kulkarni et al., Journal of the Electrochemical Society 149 (2002) G620.

Mosselveld et al., Journal of Microscopy 214 (2004) 246.

Muray et al., "Experimental evaluation of an electron-beam pulse modulated blanker (160 MHz) for next-generation electron-beam raster scan systems," J..Vac. Sci. Technol. B 13, 2488 (1995).

Okayama, "Electron-beam Lithography System Using a Quadrupole Triplet," JVST B, 6,(1) (1988), 199-203.

Schwartz et al., Journal of the Electrochemical Society 130 (1983) 1777.

Stanishevsky et al., "testing new chemistries for mask repair with focused ion beam gas assisted etching," J. Vacuum Science and Technology B, vol. 21, No. 6, 2003, pp. 3067-3071.

International Search Report, for the corresponding PCT Application No. PCT/EP2008/068220, dated Aug. 27, 2009.

Written Opinion, for the corresponding PCT Application No. PCT/EPT2008/068220, dated Aug. 27, 2009.

International Preliminary Report on Patentability, for the corresponding PCT Application No. PCT/EP2008/068220, dated Jun. 29, 2010.

* cited by examiner

| Action | Potential Pole 1 | Potential Pole 2 | Potential Pole 3 | Potential Pole 4 | Potential Pole 5 | Potential Pole 6 | Potential Pole 7 | Potential Pole 8 |
|---|---|---|---|---|---|---|---|---|
| Round lens | R0 | R0 | R0 | R0 | R0 | R0 | R0 | R0 |
| Dipole 1 | +D1 | +D1/√2 | | -D1/√2 | -D1 | -D1/√2 | | +D1/√2 |
| Dipole 2 | | +D2/√2 | +D2 | +D2/√2 | | -D2/√2 | -D2 | -D2/√2 |
| Quadrupole 1 | +Q1 | | -Q1 | | +Q1 | | -Q1 | |
| Quadrupole 2 | | +Q2 | | -Q2 | | +Q2 | | -Q2 |
| Sextupole 1 | +√2 S1 | -S1 | +S1 | -√2 S1 | +S1 | | | -S1 |
| Octupole 1 | +O1 | -O1 | +O1 | -O1 | +O1 | -O1 | +O1 | -O1 |
| Ref. numeral | 11 | 12 | 13 | 14 | 15 | 16 | 17 | 18 |

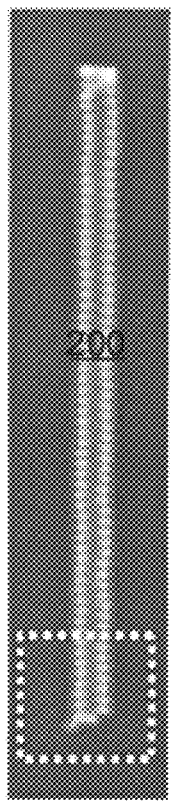 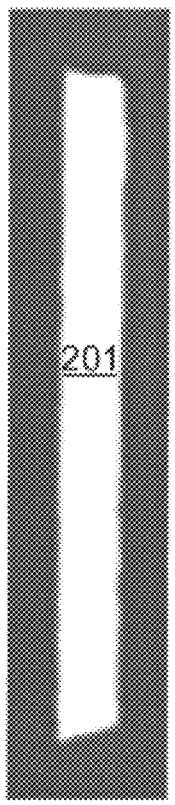
FIG. 9a  FIG. 9b
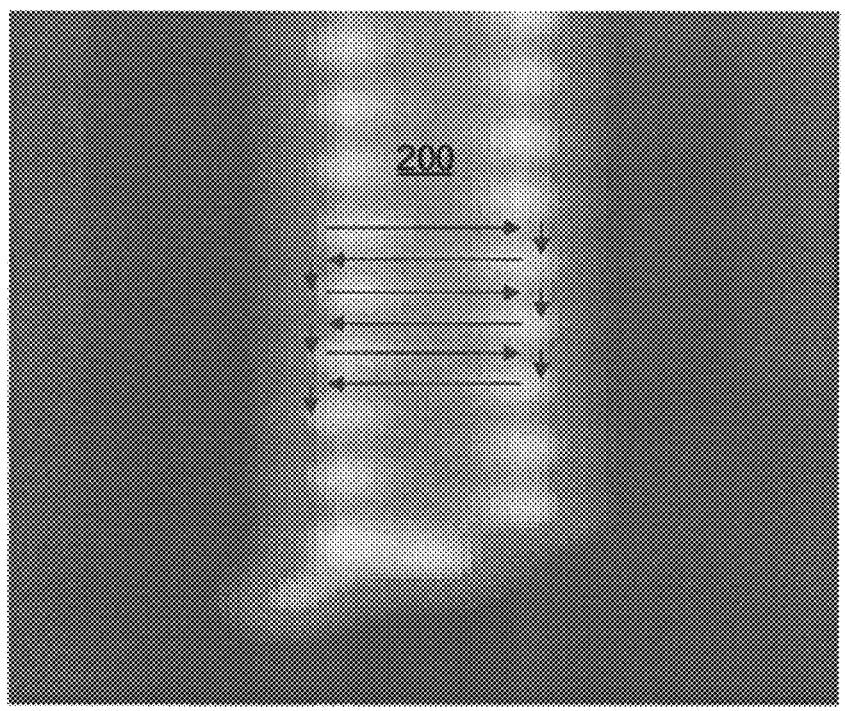
FIG. 10a

APPARATUS AND METHOD FOR INVESTIGATING AND/OR MODIFYING A SAMPLE

CROSS-REFERENCE TO RELATED APPLICATIONS

This application is a continuation of, and claims benefit under 35 USC 120 to, international application PCT/EP2008/068220, filed Dec. 23, 2008, which claims the benefit of U.S. Provisional Application Ser. No. 61/016,724, filed Dec. 26, 2007. International application PCT/EP2008/068220 is hereby incorporated by reference in its entirety.

1. TECHNICAL FIELD

The present invention relates to an apparatus and a method for investigating and/or modifying a sample with a beam of charged particles, in particular a beam of electrons.

2. THE PRIOR ART

In many microscopy techniques such as scanning electron or scanning ion microscopy, a focused beam of charged particles is scanned across the sample. The particles, which are emitted or scattered from the sample, are collected by a detector to provide a two-dimensional image. Scanned beams of electrons are also used for modifying the surface, for example by selectively removing or depositing material onto or from a sample surface. Such techniques are for example described in the publication of Koops, H. W. P., Kretz, J., Rudolph, M., Weber, M., Dahm, G., and Lee, K. L. "Characterization and application of materials grown by electron-beam-induced deposition" Jpn. J. Appl. Phys., Part 1 33(12), 7099 (1994) and by Koops et al. "Three-dimensional additive electron-beam lithography" in SPIE Vol. 2780 p. 388, as well as in the DE 102 08 043 A1. The selective deposition or removal of material with a high resolution is of particular interest for the repair of masks used in the semiconductor industry, as well as for rapid prototyping in the nano-structurization of devices in technical fields such as medicine and biology.

Further disclosure of the prior art can for example be found in L. R. Harriott "Focused Ion Beam XeF2 etching of materials for phase shift masks", J. Vac. Sci. Technol. B 11, 2200 (1993) and also by "Modelling of focused ion beam induced surface chemistry" by Klaus Edinger and Thomas Kraus, J. Vac. Sci. Technol. B 18, 3190 (2000).

Deflection systems for the beam of charged particles, as they are known in the art, are for example disclosed in G. Bonnai et al., Nuclear Instruments and Methods, Vol. 157 (1), November 1978, p. 55-63. It describes a digitally controlled scanning proton and heavy ion microprobe and digital electronics for two pairs of electrostatic deflection plates, being separated along the beam axis. The publication of Shigeo Okayama "Electron-beam Lithography System Using a Quadrupole Triplet", JVST B, 6, (1) (1988), 199-203 describes an electron beam lithography system, which uses an octopole for beam deflection and minimizes beam deflection distortions. The deflection unit comprises a digital data management and computing unit, and a combination of four 16 Bit-DACs and two 13 Bit-DACs.

Charged particle scanning microscopes usually have electrostatic or magnetic lenses for electrons, and magnetic or electrostatic deflection systems between cathode and lens ("pre lens"), in the lens ("in lens") or behind the lens ("post lens"). Pre lens systems require a double deflection system to hit the coma free point or lens center of the last lens. There is also a pre lens deflection known, which has one deflection system located in the front focal plane of the lens and is single stage, but uses the lens itself as second deflecting field. Post lens deflection systems are single stage and suffer from large deflection aberrations. In lens deflection systems require single stage deflection, but in Variable Axis Lenses (VAL) in general also double stage deflection. Electrostatic in lens deflection systems are in general single stage, and require coupling of deflection voltages on to high voltage. They are therefore rare or not used (cf. the paper of Okayama, as cited above).

In addition, the exposure of the surface also has to be controlled with respect to defocusing, stigmation and deflection. Further, an image drift and an image distortion of the primary beam has to be compensated. The image drift is the most severe problem of high precision scanning electron microscopy for metrology applications such as CD-SEM (scanning electron microscopy for the measurement of critical dimensions), since it depends on the geometry of conductive or non-conductive features on the sample. This structure can vary from sample to sample, from field of view (FOV) to FOV and from one set of sample material composition to another.

The DE 696 33 505 T2 discloses a magnetic in lens deflection system with triple magnetic shielding. An in lens double stage deflection system to correct for chromatic aberrations and beam blur is also disclosed in the DE 101 22 957 A1. This is also a magnetic system. A similar post lens deflection arrangement is disclosed in the U.S. Pat. No. 6,864,482 B2, where a filter deflection element compensates for chromatic deflection aberrations, produced by the pre lens deflection element. In this prior art document a magnetic objective lens is used with a long working distance to allow mounting of a filter device after the lens and before the sample.

In addition it is known to additionally provide an octopole system as deflection system as disclosed by J. A. Felkner et al at AT&T corp. in DE 69 608 219 T2. Another disclosure of such a system can be found in the U.S. Pat. No. 6,797,953, which presents a pre-lens deflection system before the beam reaches an electrostatic objective lens. An in-lens and post-lens, two stage, electrostatic multipole system is disclosed in the U.S. Pat. No. 6,787,772. However, again a magnetic objective lens is used. An electrostatic multipole in the space between a magnetic objective lens and a sample is further disclosed in the U.S. Pat. No. 6,182,605. This patent discloses that the multipole configuration is used as a deflector and a stigmator for the particle beam and that the potentials at the electrodes are arranged and adapted to generate an axial acceleration or deceleration field, which serves for focusing and electron extraction as well. This apparatus also uses the electrodes of the multipole to disperse reactive gases to the sample through the electrodes.

Another difficulty when modifying a surface using an electron beam is to blank the beam, which means to switch off the beam intensity. A means to do this is called a beam blanking unit or beam keying element. In SEMs as they are known from the prior art such a unit is composed of a lens for the charged particles, to focus the beam in a plane where a metal semi-plane is mounted close to the beam employed to stop the beam. A plate capacitor follows the lens, when viewing in the beam direction. When the beam passes through the middle plane of the plate arrangement and voltages of opposite sign and equal size are applied to the plates, they deflect the beam onto the catching aperture. In the deflected state the beam intensity is stopped there and can no longer reach the sample. However, during the deflection the virtual source image moves, due to the change of the beam direction by the deflection plates. This motion of the source is imaged to the sample and creates an uncertainty in the edge placement of the beam, which deteriorates the resolution of any etching or deposition process on the sample.

A further and more accurate method of beam blanking known in the prior art is also called "conjugate blanking", which allows to modulate its intensity without changing the spot position on the sample, which is during the modulation exposed to the beam. One approach for providing such an intensity modulation using a conjugate blanking system uses a setup disclosed by Andrew Muray, Dave Colby, Robin Teitzel, and Mark Gesley, in the publication "Experimental evaluation of an electron-beam pulse modulated blanker (160 MHz) for next-generation electron-beam raster scan systems", J. Vac. Sci. Technol. B 13, 2488 (1995). However, the disclosed solution is very complicated and costly.

In view of the above, it is the problem underlying the present invention to provide an apparatus and a method enabling electron beam induced etching and/or deposition with a better resolution than the devices and methods known from the prior art.

3. SUMMARY OF THE INVENTION

The system of the invention has a charged particle source and at least one particle optical element forming a charged particle beam of charged particles emitted by the charged particle source. The system according to the invention also has an objective lens which can form a charged particle probe from the charged particle beam. Additionally a first electrostatic deflection element is arranged—in the direction of propagation of the charged particles emitted by the charged particle source—downstream of the objective lens. The electrostatic deflection element should be designed to deflect the charged particle beam in a direction perpendicular to the charged particle optical axis defined by the objective lens with a deflection bandwidth of at least 10 MHz.

A deflection bandwidth of 10 MHz means that the charged particle probe can be moved from one position to another in the direction perpendicular to the charged particle optical axis of the objective lens or the system with a frequency of 10 megahertz or more.

The deflection element should be a pour electrostatic one, i.e. without providing magnetic deflection fields, to be sufficiently fast for deflecting the charged particle beam with a sufficient high deflection bandwidth.

The deflection element should have electrodes which have an electrical capacity with respect to each other and with respect to all further components arranged in the vicinity of deflection element, for example the components of the objective lens, which is less than 50 pF, preferably even less than 10 pF.

The objective lens advantageously comprises an electrostatic immersion lens by which the charged particles passing the lens are—in the direction of beam propagation of charged particles emitted by the charged particle source—decelerated from a higher kinetic energy in the range above 10 keV to a lower kinetic energy of 5 keV or less. By arranging the electrostatic deflection element on the low energy side of such immersion lens, i.e. on the side of the immersion lens on which the charged particles have the lower kinetic energy, the electrostatic deflection element can be operated with considerably lower voltages applied to its electrodes for deflecting the charged particle probe a predefined amount or angle. By this the advantage can be used that lower voltages can be applied and switched with considerably higher frequencies than higher voltages which makes it easier to reach high deflection bandwidths.

The above advantages of an electrostatic immersion lens also can be reached when the objective lens is a combination or serial arrangement of an electrostatic immersion lens and a magnetic lens.

By a deflection element with a deflection bandwidth of 10 MHz or more it is possible to achieve reproducible dwell times well below 1 microsecond. More preferable the deflection bandwidth is several tens or even larger than hundreds of megahertz. In the latter case additional refresh times and a high speed blanking with rise times in the order of a few nanoseconds or less is possible. Both have not been possible with standard SEM deflection systems, which are commonly used in research and applications of electron beam induced surface chemistry.

In addition a beneficial and valuable outcome of this arrangement is the possible reduction of system components, because no integrated fast beam blanking system arranged—in the direction of propagation of the charged particle beam emitted by the charged particle source—upstream of the objective lens is necessary. This is accomplished by using the electrostatic deflection element as a beam blanking means by supplying a special deflection signal, which deflects the beam away from the opening of a downstream shielding element and in this way blocks the beam before it reaches the sample.

As a result, the preferred embodiment allows to omit conventionally used beam blanking elements and provides a more economic and a technically simpler solution. Furthermore a maintenance which requires venting of the electron-optical column and mechanical cleaning of a metal blade is no longer necessary, since the deflection and blanking element is attached underneath the actual column.

In the presently preferred embodiment, the apparatus further comprises a shielding element with an opening for the beam of charged particles to pass through, wherein the shielding element is arranged—in the direction of propagation of charged particles emitted by the charged particle source—downstream of the electrostatic deflection element. The distance $d_1$ between the electrostatic deflection element and the shielding element is preferably in the range of $10\,\mu m < d_1 < 2.5$ mm. The diameter of the opening of the shielding element and the distance $d_2$ to the surface of a sample on which the charged particle probe is formed or the plane—perpendicular to the optical axis of the objective lens—in which the charged particle probe is formed by the objective lens, are preferably essentially the same. The shielding element is therefore sufficiently closely positioned to the surface in which the charge particle probe is formed to reduce the influence of charge accumulation effects at the surface of a sample arranged in that plane on the beam of charged particles.

For the sake of a short working distance, i.e. the free space distance between the last electrode of the objective lens and the sample, the electrostatic deflection element should be kept short. However, for the required deflection sensitivity, which is directly proportional to the length of the electrostatic deflection field, the working distance should be as long as possible. The above preferred values present a compromise to meet both requirements. In addition, the distance to the shielding element is limited by the requirement to insulate 10 V to 100 V of the electrostatic multipole electrode voltage to the shielding element, and to the objective lens electrode. Accordingly, a gap between these surfaces should be larger than $10\,\mu m$ to limit the electrostatic field strength between the surfaces to a value below voltage breakdown in vacuum between polished surfaces, which is approximately 10 KV/mm.

In a preferred embodiment the electrostatic deflection element has an opening of a sufficient size not to obstruct the primary beam and a secondary beam of charged particles in a field of view having a diameter of preferably $d_3 < 100$ μm. To this end, the opening of the electrostatic deflection element has preferably an inner diameter $d_4$ in a range of 0.05 mm $< d_4 <$ 5 mm and preferably a length l in a range of 0.05 mm $< l <$ 20 mm.

Preferably, the electrodes of the electrostatic objective lens and the electrostatic deflection element have a capacity with respect to each other and with respect to further components of the apparatus adjacent to the electrodes of less than 50 pF, more preferably of less than 10 pF. Since the basic principle of the present invention is to provide a means for deflecting, stigmating and focusing the beam at high speed, the capacity of the electrodes with respect to each other and to the surrounding electrodes and metal plates must be kept small, that is preferably in the above indicated range, in order not to require excessively high loading currents from the fast amplifiers of the voltage supply system. With the preferred capacity values a deflection frequency of 100 MHz or up to 10 GHz per pixel can be reached. A full field of view is then scanned in 1 msec using 1000 pixels per line and 1000 lines.

According to a further aspect of the invention, the apparatus may further include a second electrostatic deflection element arranged on the side directed to the particle source of the electrostatic objective lens. Preferably, the apparatus comprises means to control the first and the second electrostatic deflection element and the electrostatic objective lens so that the primary beam of charged particles is deflected without changing the spot position, where the electron beam hits the plane in which the charged particle probe is formed. In addition, a blocking element is preferably arranged between the first deflection element and the plane in which the charged particle probe is formed, which blocks at least partly the primary beam of charged particles, when the beam is deflected, so that the intensity of the remaining electron beam, which reaches the essentially unchanged spot on the surface of the sample, is modulated.

The combination of the second electrostatic deflection element (pre lens system), the electrostatic objective lens and the first electrostatic multipole deflection element (post lens system) can make use of a first deflection of the beam by the pre lens system to deflect the beam to an angle so that it enters the lens in an off-axis direction. When the second electrostatic deflection element is arranged such that its real or virtual deflection point lies on the optical axis of the objective lens and in the source-sided focal plane of the objective lens, the charged particle beam is deflected by the objective lens to a direction parallel to its optical axis. The beam then enters the post lens system, which acts as a third deflector to position the beam. The beam is deflected such that it extends preferably close to the rim of an aperture or close to the grid bar of a shielding element such as a mesh. At the same time, the focus of the beam probe is adjusted to be at the surface of a sample in a desired location.

Deflecting the beam by the three deflection systems, i.e. pre lens deflection system, lens, and post lens deflection system, now allows to scan a small image field at the sample (or in the plane in which the charged particle probe is formed). In addition, the post lens deflection system can deflect the beam so that it hits the rim of the aperture or the grid bar of a shielding mesh, so that the beam is effectively switched off or at least its intensity is reduced, without any essential changes of the spot position, where the (remaining) beam hits the surface of the sample.

Finally, the present invention relates to a method for investigating and/or modifying a sample comprising the steps of directing a primary beam of charged particles onto the surface of the sample, exposing the surface of the sample to one or more gases and deflecting the primary beam of charged particles onto a plurality of positions on the surface of the sample with a minimum pixel dwell time of 100 nanoseconds or less.

During the scanning of the charged particles across the sample two fundamental time constants control the chemical reactions on the surface. The time the beam stays at one location or on one pixel is called pixel dwell time. After that dwell time the beam moves on to expose other locations of the pattern. During this time the incident current on the above mentioned location or pixel is essentially zero. The time which passes between two exposures at the same location or on the same pixel is called refresh time. It consists of the number of pixels or positions to be exposed of the pattern times the dwell time plus an optional extra refresh time during which the beam is blanked entirely.

The present inventors have for the first time realized that short dwell times not only increase the yield of some reactions but are in fact necessary to enable certain types of reactions. For example for the removal of the absorber material on a binary photo mask with electron beam induced etching short dwell times are needed to achieve any significant etch rates. Additionally the refresh time (combined with certain scan strategies and the even harder to control line refresh time) has to be kept at a certain value to avoid several unwanted side effects like river-bedding and over etch.

Preferably, the minimum pixel dwell time is ≦60 nanoseconds, wherein the dwell time for a pixel or location can preferably be controlled independently from a refresh time for the pixel.

According to a further aspect of the disclosed method, the plurality of pixels or locations are scanned so that consecutive scan paths are essentially decoupled, for example by scanning the plurality of pixels or locations in one or more serpentines with a line step size >1 pixel, preferably between 2 and 20 pixel.

According to still another aspect of the disclosed method, the sample is at least partially covered by an additional material layer, preferably an absorber layer on a lithography mask, wherein the pixels or locations on the sample are scanned under the control of a unit, which evaluates a secondary beam of charged particles generated on the sample to avoid the further scanning of areas of the sample, which are already sufficiently modified.

In the preferred embodiment, the sample comprises a chromium layer and the gases comprise a compound including a halogen and an oxygen releasing compound such as $XeF_2$ and $H_2O$. The partial pressure of the one or more gases is preferably controlled by cooling a reservoir, which supplies the gas to the sample. $H_2O$ is preferably kept in a reservoir at a temperature between −30° C. and −40° C. and $XeF_2$ is preferably kept in a reservoir at a temperature of approximately 0° C.

Further modifications of the claimed apparatus and the claimed method are the subject matter of further dependent claims.

4. SHORT DESCRIPTION OF THE DRAWINGS

Figure 2:
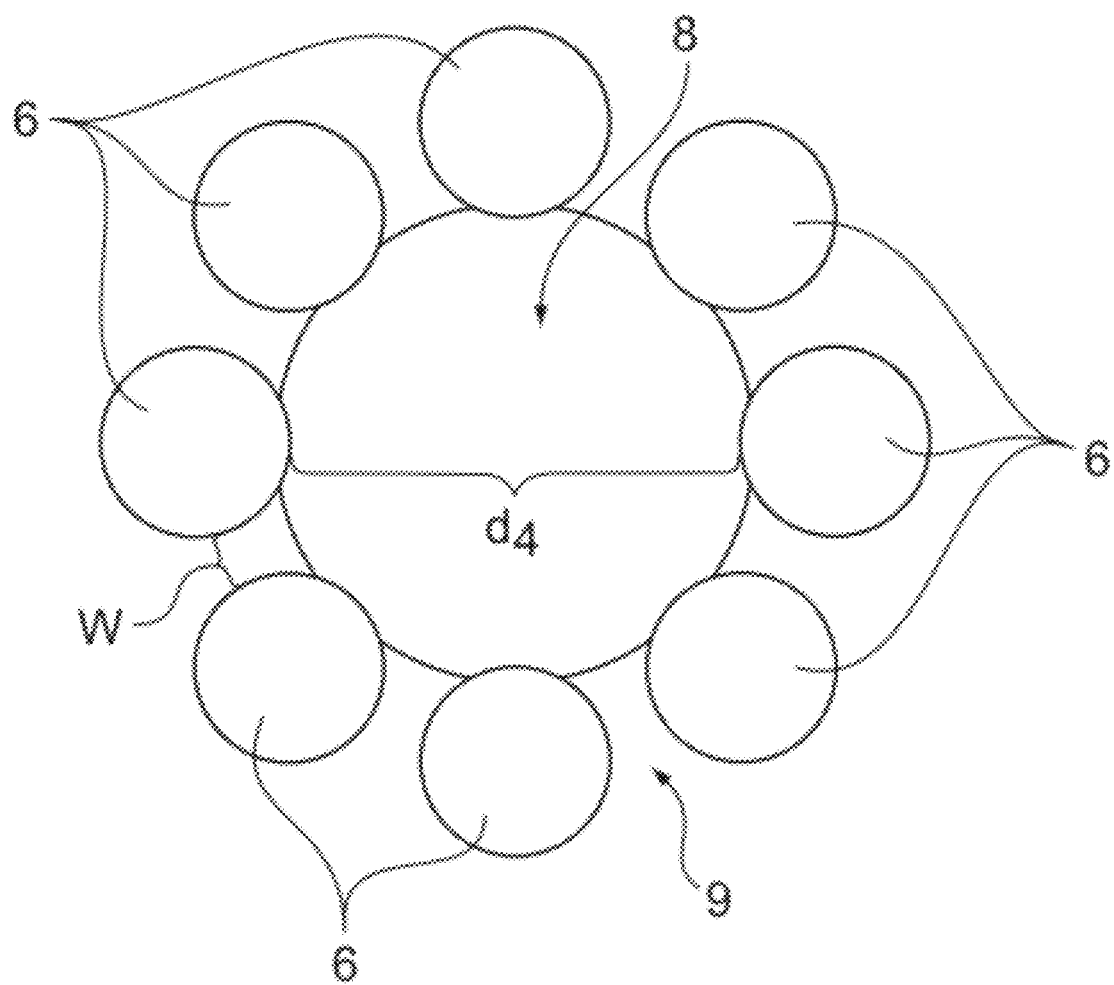
Figures 3A, 3B:
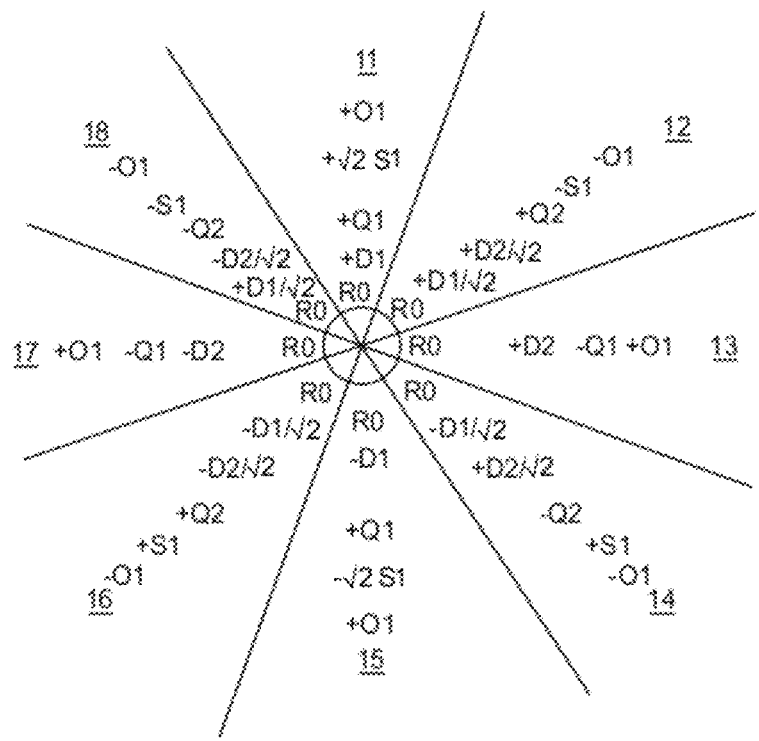
Figure 4A:
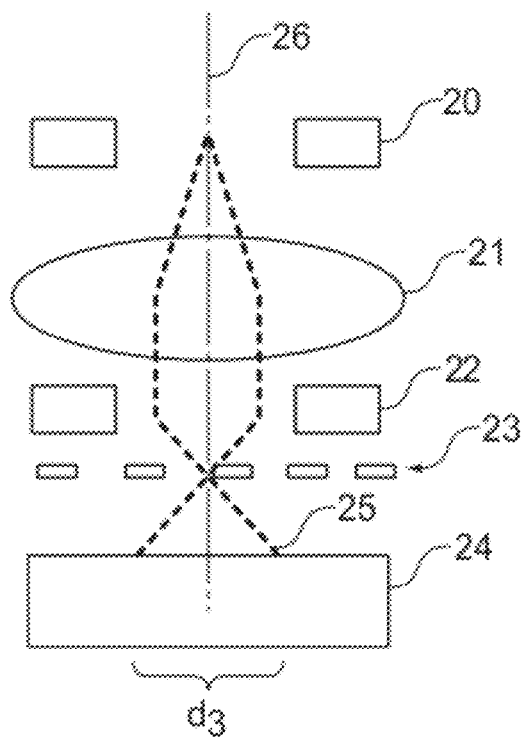

In the following presently preferred embodiments are further described with reference to the drawings, which show:

FIG. 1: A vertical cross-section of a presently preferred embodiment of an apparatus according to the invention;

FIG. 2: A top view of an embodiment of the electrostatic multipole deflector element in a preferred embodiment, with a schematic representation of the resulting electrostatic field;

FIGS. 3a,b: A schematic representation of the voltages applied to the electrodes of an electrostatic multipole deflector element in accordance with the invention;

FIG. 4a: A schematic representation of the deflection of the beam in an apparatus comprising two electrostatic multipole deflector elements, one above the objective lens and one below the objective lens; and FIG. 4b: A schematic representation, how the apparatus of FIG. 4a can be used for a modulation or blanking of the beam, without changing the exposed spot on the sample.

Figure 4B:
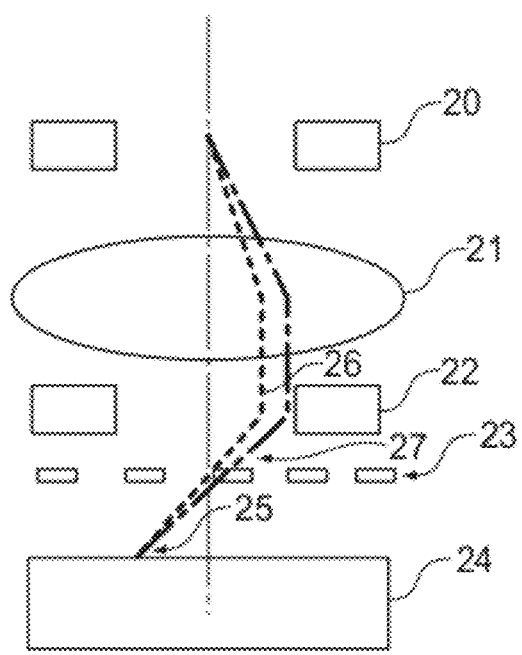
Figure 4C:
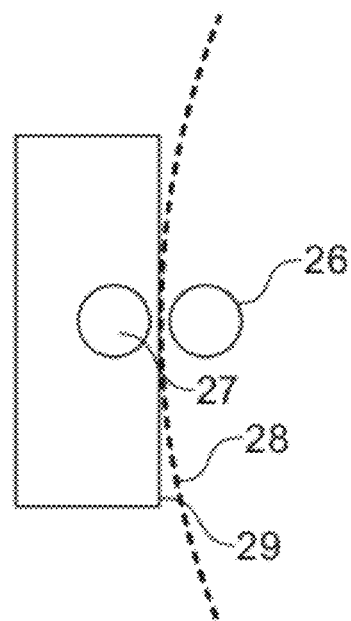
Figure 4D:
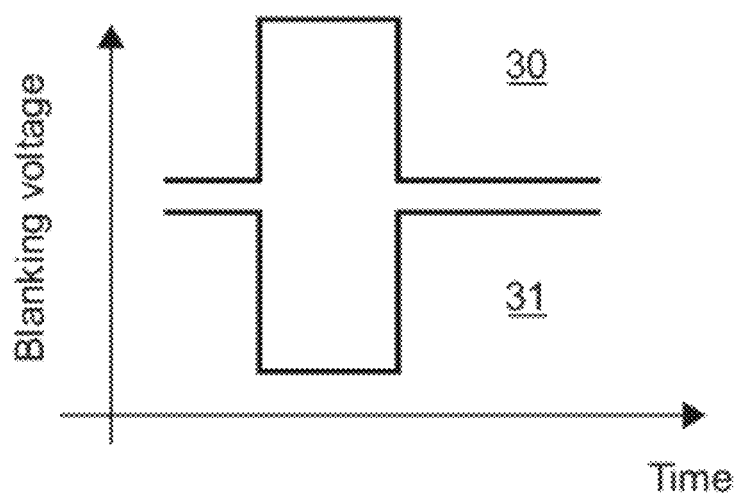
Figure 5A:
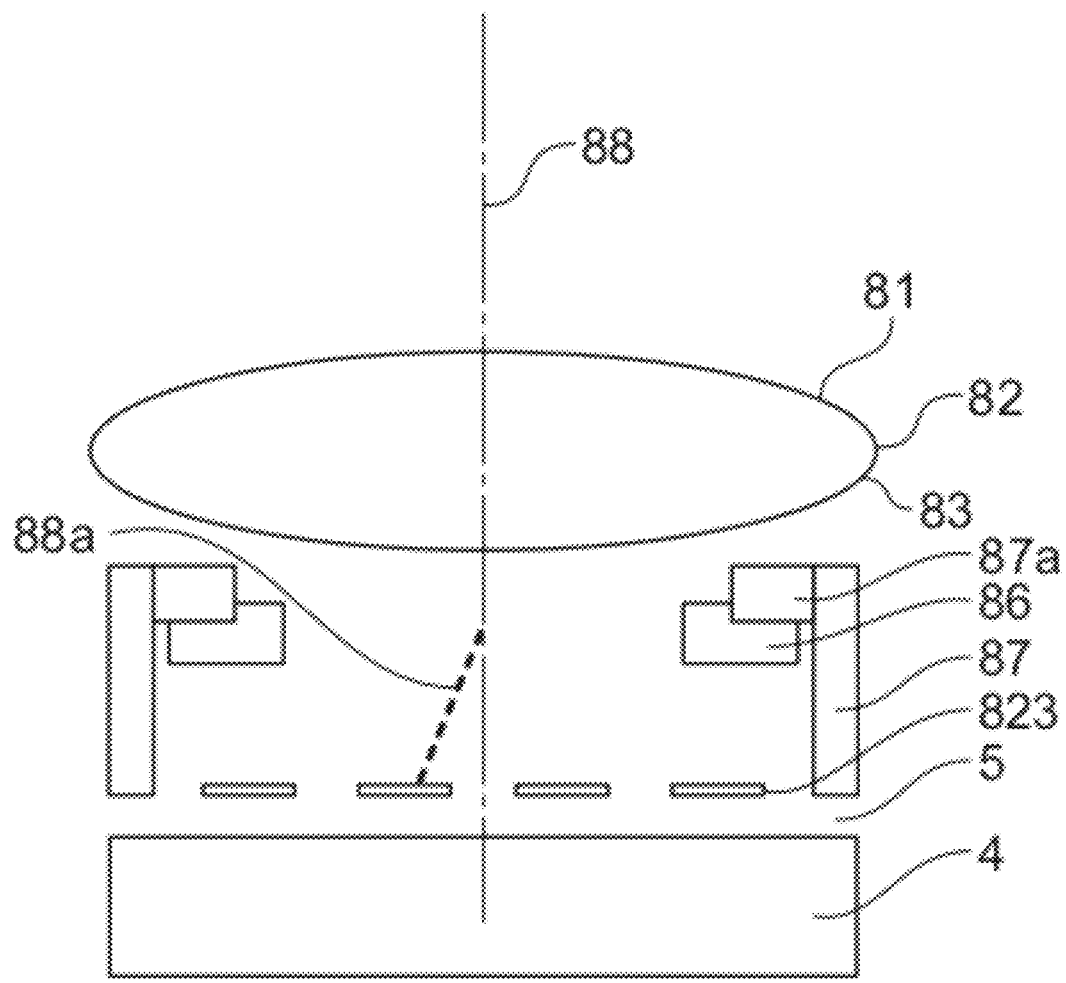
Figure 5B:
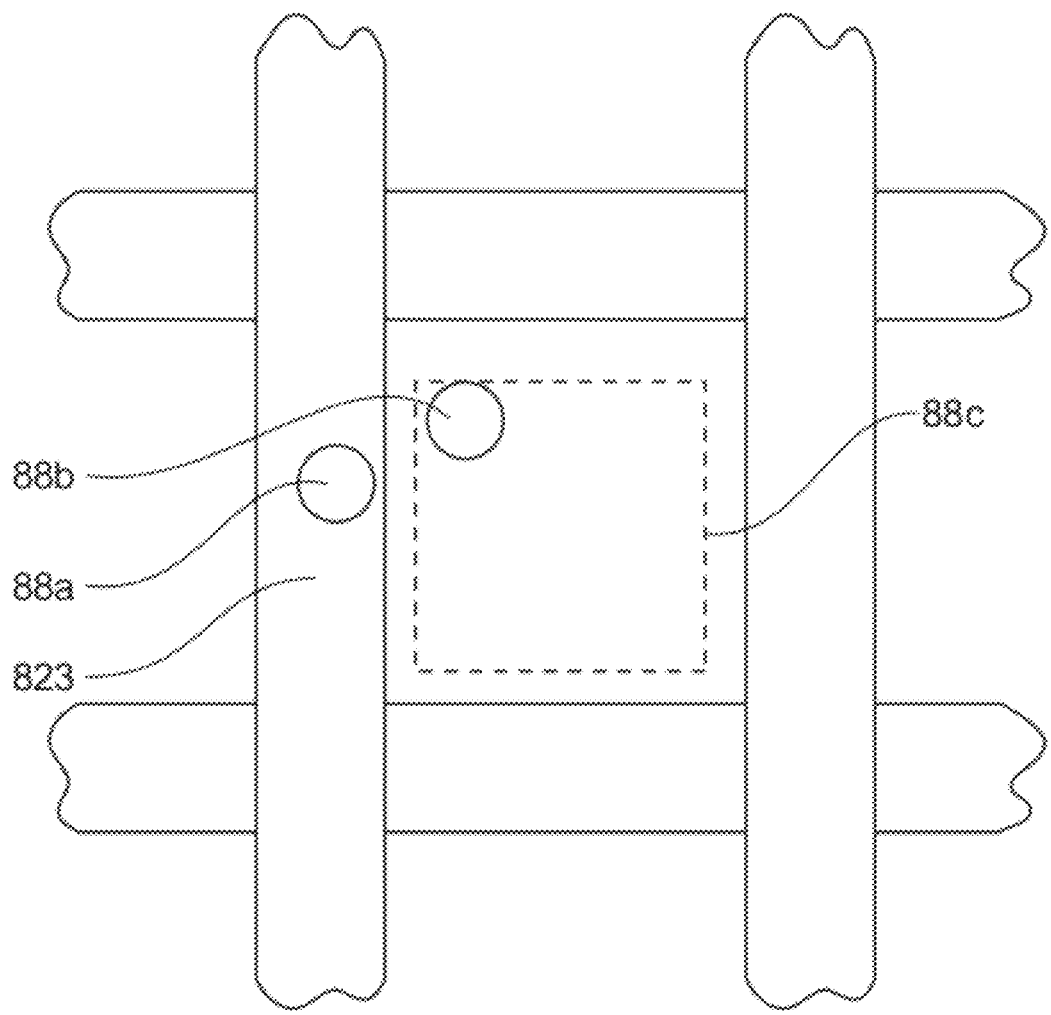
Figure 5C:
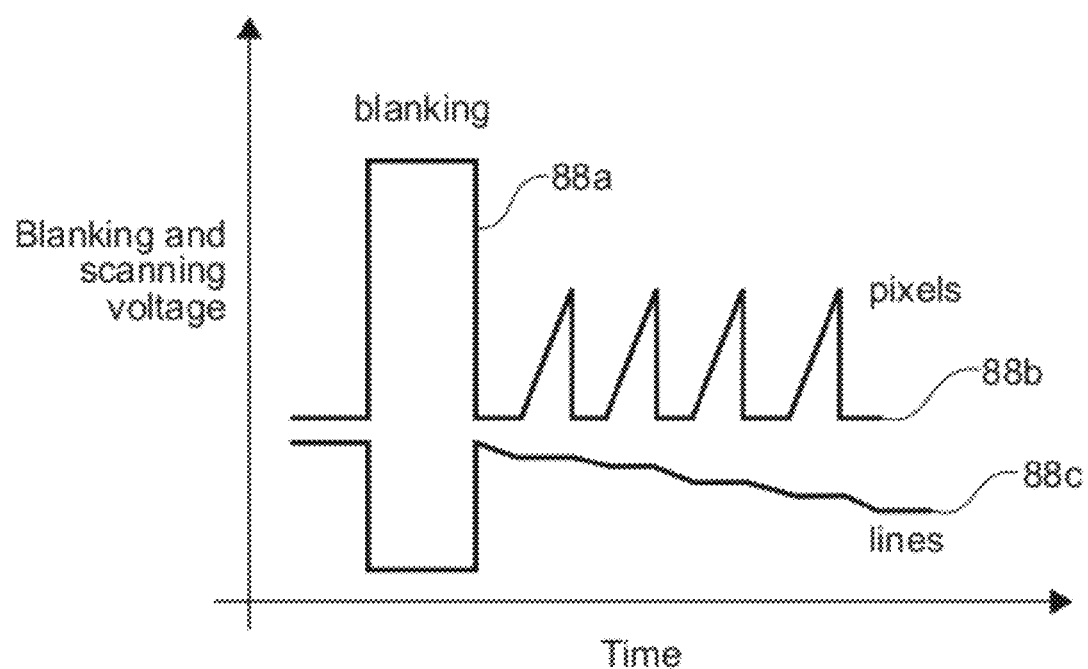
Figure 6A:
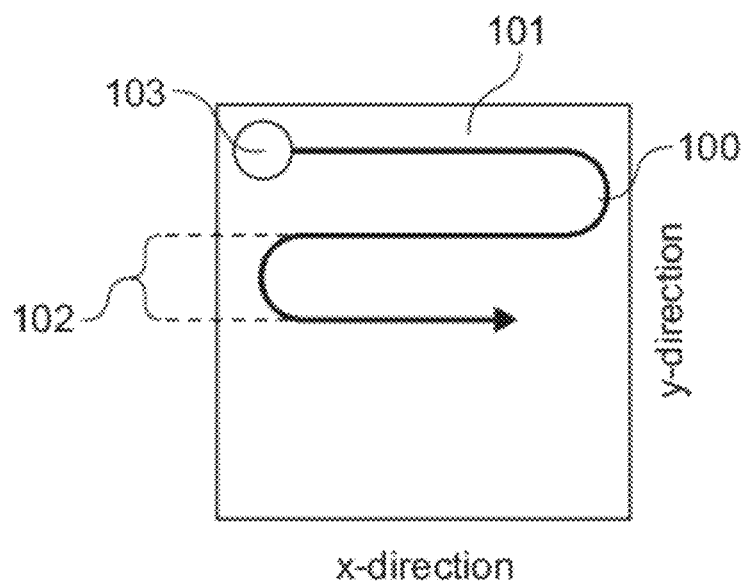
Figure 6B:
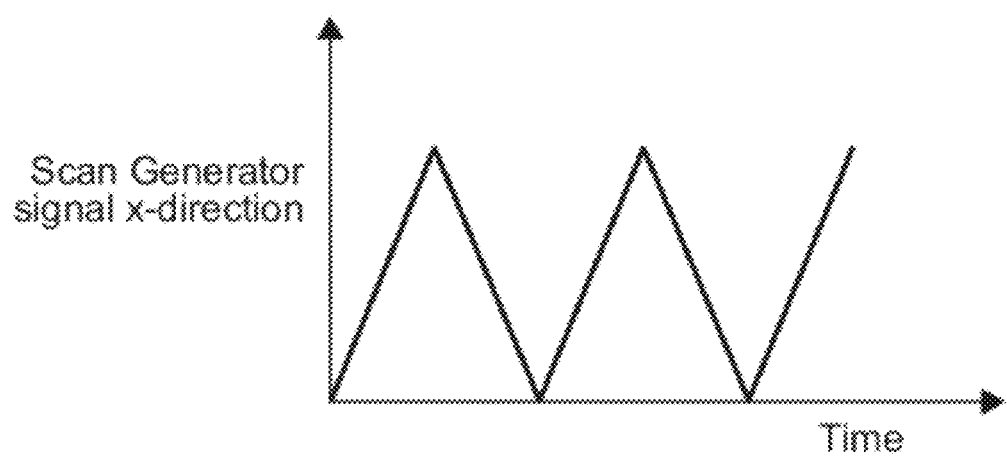
Figure 7A:
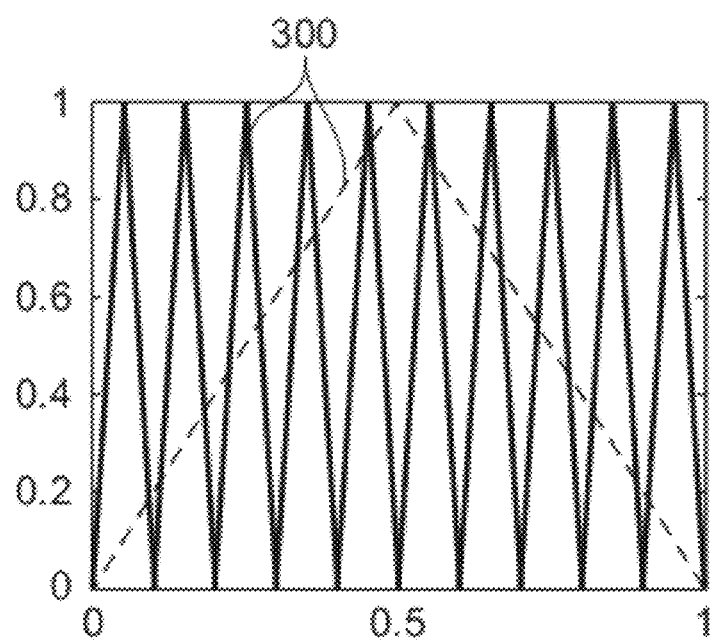
Figures 8A, 8B:
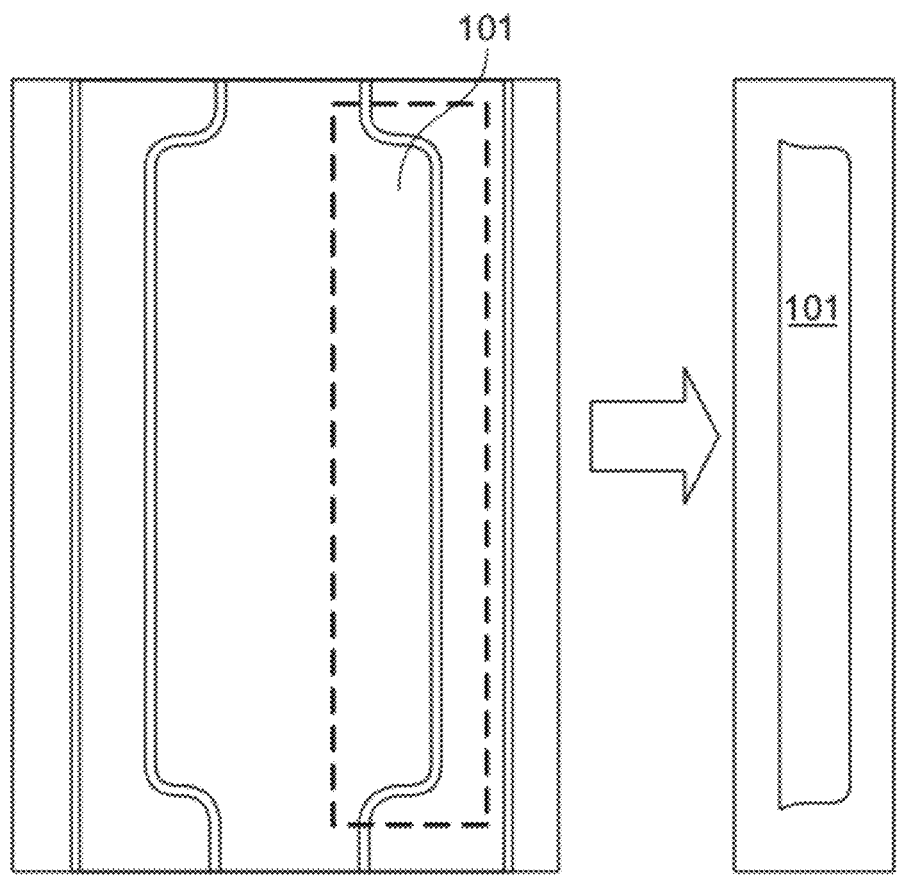

FIG. 4c: A top view in the plane of a shielding grid for illustrating the blanking deflection;

FIG. 4d: A schematic representation of the blanking voltages applied to the electrostatic multipole deflector elements;

FIGS. 5a-c: A further embodiment of a blanking unit in accordance with the present invention;

FIG. 6a: A scan path in serpentines in a preferred embodiment of the disclosed method;

FIGS. 6b, c: The scan generator signal for the x-direction and the y-direction, respectively, for a serpentine scan pattern in a preferred embodiment of the present invention;

FIGS. 7a, b: A comparison of the scan beam paths resulting from a signal chain with a low bandwidth and a high bandwidth for a slow signal and a fast signal;

FIGS. 8a, b: A schematic view of a defect of a lithography mask and the extracted area to be processed to remove the defect;

FIGS. 9a, b: A comparison of processing the area shown in FIG. 8b with a deflection system of low bandwidth and of high bandwidth; and FIGS. 10a, b: detailed views of the lower end of the area shown in FIGS. 9a,b.

5. DETAILED DESCRIPTION OF PRESENTLY PREFERRED EMBODIMENTS

In the following, presently preferred embodiments of the claimed apparatus and the claimed method are described with particular reference to a scanning electron microscope. However, it is to be understood that the present invention can be used for any apparatus, wherein electrically charged particles are used to study, image or modify a sample either on its surface or in its interior regions. A particular important field of use is the repair of masks for the semiconductor industry. In this case the scanned electron beam is used to selectively deposit or remove material, in particular a chromium layer from the surface of the mask, which is typically made out of quartz.

FIG. 1 presents a schematic vertical cross-section of an embodiment of the invention. This system is used to process a work piece 403, namely a photo mask. This photo mask serves for use in a photolithographic process and carries structures which are photographically transferred to a radiation sensitive layer (resist) with which a semiconductor substrate (wafer) is coated. In relation to the wavelength of light used to transfer the structures from the mask to the wafer the critical dimensions of the structures are relatively small. Therefore, the structures on the mask are not merely embodied as alternatively transparent and absorbent structures, but also can provide a defined phase shifting effect for the light used for the imaging process. Accordingly, the structures of the mask 403 must relatively precisely comply with predetermined limits for location-dependent material densities.

The material processing system 1 allows to produce such structures by material deposition at selected locations and by material removal from selected locations.

The material deposition is effected herein by supplying a reactive gas (precursor) to the proximity of the location selected for the process. At the same time, an electron beam of primary electrons is directed to the selected location. Primary electrons, or backscattered or secondary electrons released from the work piece by the primary electrons, activate the reactive gas so that components of the reactive gas are deposited at the selected locations or in close proximity thereto. As a result, the desired material deposition is effected in the area of the selected location.

The material removal is effected in a similar way. However, a different reactive gas is supplied which is activated by the primary electrons, or backscattered or secondary electrons generated by the primary electrons, such that the reactive gas reacts with the material of the work piece at the selected location or in close proximity thereto and converts components of the material to a gaseous or vapour compound which escapes from the work piece. Thus the desired material removal is achieved in the area of the selected location.

To this end, the work piece is mounted on a work piece holder 405. The work piece 403 and the work piece holder 405 are disposed in a processing chamber 407 which may be evacuated by means of a turbo molecular pump 409 and a further pre-vacuum pump not shown in FIG. 1.

A spatial position of the work piece holder relative to the processing chamber can be changed in the three spatial directions x, y, z by means of actuators not shown in FIG. 1. Plural laser interferometers 411 are provided to detect the position of the work piece holder 405 relative to the processing chamber 407.

An electron microscope 415 is mounted in a vacuum enclosure 413 of the processing chamber 407 such that the optical axis 417 of the electron microscope 415 extends in z-direction and a sample plane 419 of the electron microscope 415 is within the processing chamber 407. The work piece holder 405 is positioned within the processing chamber 407 such that a surface of the work piece 403 is disposed substantially in the sample plane 419 of the electron microscope, i.e. in that plane in which a focussed probe of electrons (constituting the charged particle probe) is generated.

The electron microscope 415 comprises an electron source 401 and a magnetic coil 425 acting as a condenser to form an electron beam from electrons emitted from the electron source 401. The electron beam is directed downwardly along an optical axis 417. An Objective lens 427 of the electron microscope 415 comprises an upper pole piece 429 and a lower pole piece 431, a coil 432 being provided there between. The pole pieces 429, 433 define a pole piece gap toward the optical axis 417 of the overall system, which concurrently forms the optical axis of the objective lens 427. The objective lens 427 focuses the electron beam in the sample plane 419 of the electron microscope 415, i.e. in the sample plane an electron probe with a small cross-section in the range of a 1-10 nanometers is formed.

The electron microscope 415 further comprises an electrostatic immersion lens which is formed by an upper electrode 402 and a lower electrode 433. The upper electrode extends from the anode 404 of the electron source 401 through the complete electron optical column and ends at the lower pole piece 431 of the objective lens 427. The lower electrode 433 of the electrostatic immersion lens is arranged—in the direction of propagation of electrons emitted by the electron source 401—downstream of the lower pole piece of the objective lens. The upper electrode 402 is supplied with the anode potential, the lower electrode 433 is supplied with a potential with is negative compared to the anode potential and should be the same as the potential of the sample. Therefore, by the action of the electrostatic immersion lens primary electrons are—when passing the objective lens 427—decelerated from a higher kinetic energy corresponding to the anode potential to a lower kinetic energy corresponding to the difference between the anode potential and the potential of the lower electrode 433. Preferably the kinetic energy of the electrons downstream of the lower electrode is 5 keV or less.

Following downstream of the lower electrode 433 an electrostatic deflection element 437 is provided. The electrostatic deflection element is formed by small electrodes which form an electrostatic multipole and serve to deflect the electron beam perpendicularly to the optical axis 417 in the x-direction and in the y-direction. A controller (not shown) is provided to control the voltage supplied to the electrodes of the deflection element 437 and thus the deflection of the electron probe in the sample plane 419.

In the direction of propagation of primary electrons emitted by the electron source 401 downstream of the deflection element 437 an electrically conductive shielding element 439 is provided. This shielding element 439 can be formed as a flat extended electrode or in the form of a grid or mash. The shielding element 439 serves to reduce disturbing influences of charges accumulated on the surface of the sample 403 on the primary electron beam. The shielding element has a hole 440 in the region of the optical axis 417 to allow the primary electron beam to pass through.

The shielding element 439 at least has one or two additional holes 441, 442 through which gas molecules emitted from the terminating portions of a gas supply system 443 can reach the surface of the sample 403 in close proximity to the optical axis. By the aid of the gas supply system either a pre-cursor gas or a reactive gas can be supplied as required for the actual application.

In the column, in the focal plane of the objective lens 427 directed to the side of the electron source 401, a further electrostatic deflection element 435 is provided which can be operated in cooperation with the deflection element 437 arranged downstream of the objective lens 427 in a manner which will be described in more detail below.

An in-lens detector 443 is arranged in the electron optical column upstream of the objective lens 427 between the condenser lens 425 and the objective lens. This in-lens detector serves for detecting either backscattered electrons or secondary electrans emitted by the sample because of the impinging primary electron beam. The detection signal of the in-lens detector 443 is read out by a controller. To take an electron microscopic image of the work piece 403 in a portion disposed in the object plane 419 around the optical axis 417 the controller controls either the first deflection element 437 or the second deflection element 435 such that the electron probe systematically scans the portion. The signal intensities recorded by the in-lens detector 443 in the dependence of the deflection are stored by the controller for further processing and/or display.

As further shown in FIG. 1 two pressure limiting apertures 450, 451 are provided between the electron source 401 and the objective lens 427 so that the vacuum system 413 between the electron source 401 and the objective lens 427 is split-up into three vacuum stages 455, 456, 457 each of which is evacuated by a separate appropriate vacuum pump 452, 453, 454 so that in each of the stages an appropriate vacuum can be maintained.

The electrostatic deflection element 437 can be formed in the form of an octopole which is preferably made from a non-magnetic material and will therefore not change an additional magnetic field, which may protrude lower electrode 433 of the electrostatic immersion lens. For an electrostatic insulation of the octopole its electrodes are insulated with respect to the support ring 7 with which the octopole is mounted to the lower pole piece 431 of the objective lens 427.

FIG. 2 presents a schematic top view of an embodiment of the octopole with its eight cylindrical electrodes 6. The influence on the electrostatic aequipotentials 8 is also shown. The insulating space 9 between the electrodes 6 of the octopole is left without material to avoid charging of any insulating surface, which could eventually lead to sudden discharges and result in instability of the electron beam. Alternatively, the octopole can also be constructed, as often commonly used, with slots as insulating space between segments of a circular bore, or from a set of pole piece blades pointing to a common center and having an insulating space in between (not shown).

The small size of the octopole having in the described embodiment an inner diameter between 5 mm and 1 mm and an electrode length between 20 mm and 0.05 mm, as well as the use of thin potential feeding wires (not shown), which are insulated with respect to the support ring 7, limits the involved capacities to less than 50 pF preferably less than 10 pF and allows therefore very high frequencies e.g. 10 MHz to 10 GHz as deflection frequency. As a result the required minimum pixel dwell time of 100 nanoseconds or less can be achieved.

A high deflection speed is beneficial for high throughput lithography, high speed imaging, and all operations, wherein the sample shall not be exposed to many charged particles, while a beam is moving a distance on the sample. It is also needed when fast focusing, deflection, and/or stigmation with automated routines are performed to meet the requirements of samples having a very rough topography, for example with surfaces having steps of micrometer size over a micrometer distance.

In an apparatus as shown in FIG. 1, the positioning of the beam is performed in a first step by referencing the beam to a mark present on the sample (not shown), in a second step by moving the stage of the sample, which is for example controlled by an accurate position control system like a high resolution laser interferometer or a position indicator with measuring scales. Due to the fact that mechanical stages cannot define a position with an accuracy of better than 0.5 µm, the deviation of the wanted working position and the actual stage position, which is also the beam position, is in a third step measured by the interferometer and fed back to the beam deflection system. Even with a small FoV having a diameter of only 20 µm this uncertainty is tolerable to find a defect or a structure on the sample surface, which is to be investigated or processed. This multi-step approach is generally successful, since high resolution SEMs, which are generally used for this task, are built to exclude an additional drift of the beam with respect to the lenses and the sample of more than a few nm/hour. In a fourth step, the beam location with respect to the structures of the sample is monitored by a single scan imaging step. Based thereon the work area is defined and the work can start. Work means in this context operations such as measuring a distance, depositing material, etching material, or reviewing the previous work by recording a high resolution image.

FIGS. 3a and 3b schematically present the electrodes of an octopole (reference numerals 11 to 18) and indicate the applied potentials for a round lens R0, two deflectors D1 and D2, two quadrupoles Q1 and Q2 for stigmating, a sextupole S1 and an octopole O1 for partial corrections of aberration components. Since the sextupole field strength is assembled from an 8-pole configuration, it is possible to rotate the sextupole field by setting the calculated voltages to the poles. The octopole can only be rotated by 45 degrees by reversal of all polarities. The indicated potentials all are to be superimposed to the poles 11-18, wherein the sum of all the components on each electrode is to be determined by a computer and output by a fast D/A converter as a voltage to the respective electrode.

The influence of the various potentials on the electrodes 11-18 of the preferred octopole on the beam of charged particles can be described as follows:

The excitation of the octopole with a potential R0 added to all electrodes 11-18 provides a balancing of the octopole position. In other words, the electrode voltage compensates the position of the octopole in the decelerating fringe field of the electrostatic objective lens and helps to minimize the influence of the positioning of the octopole element. An additional acceleration or deceleration of the beam can also be achieved by R0, which causes a focusing or defocusing of the beam.

A dipole field D1 and D2 added to the poles of the octopole according to the distribution and values as given in FIG. 3b allows to shift the beam in x- and y-direction or in any arbitrary directions. In a dipole arrangement, one would generally use only the opposite electrodes of poles 11 and 15, as shown in FIG. 3a to generate a deflecting field perpendicular to the electron beam. Adding potentials also to the neighbouring poles allows to enlarge the area of the homogeneous field inside the octopole. It is therefore beneficial to the general task and reduces the deflection distortion.

Employing two generally perpendicularly oriented deflection fields provides the possibility to steer the beam in all directions with the proper potential contribution added to the electrodes. Using the two quadrupole potential distributions Q1 and Q2 allows to influence the ellipticity of the beam generated by a two-fold astigmatism. To compensate this deficiency, two quadrupole fields are used and adjusted in strength. Compensation of the astigmatism is obtained by setting the two quadrupole potentials Q1 and Q2 to a special ratio, which quasi rotates the quadrupole field by an angle. In addition, the potential is chosen proportional to the ratio as set for the azimuthal orientation so that the two-fold focusing and defocusing action on the beam can be used to compensate for the astigmatism. A misaligned mounting of the octopole can generate additional astigmatism, and can be compensated with such potentials.

A three-fold astigmatism originates generally in the column and lenses above and within the objective lens of a SEM. A sextupole field allows the correction of such a three-fold astigmatism of the beam, as well as the correction of a coma aberration component. The azimuthal adjustment of the orientation of the field must be generated by numerically calculating the required S1 potentials for the rotated sextupole. Three-fold components of the beam can also originate from misalignments of lenses and other optical components, like deflectors, and stigmators. The octopole, which is fixed in its orientation due to the mounting of the octopole system, can be varied by changing the Q1 potential, and can be rotated in fixed steps of 45 degrees. It can be used to compensate for the coefficient describing the rotational symmetrical portion of the spherical aberration.

FIGS. 4a-4d illustrate a further aspect of the present invention. FIG. 4a shows the beam path for a conjugate blanking system, which uses a pre lens deflecting multipole 20, an objective lens 21 and a post lens deflecting multipole 22 in conjunction with an aperture plate or grid 23 located close to the sample 24. As will be explained below, the two multipoles 20, 22 and the objective lens 21 allow that the probe spot 25 remains at a fixed position on the sample 24, even if the intensity of the beam is switched off or modulated.

To this end, the deflection of the pre lens deflecting multipole 20, the objective lens 21 and the post lens deflecting multipole 22 is adjusted so that the beam 26 passes close to the edge of a blocking element such as an aperture plate or a grid bar of a shielding mesh 23. FIG. 4b shows the beam path 26 (dotted line) in this situation.

For modulating the intensity of the beam or for fully blanking the beam, a control unit (not shown) applies synchronous blanking signals 30, 31 to the pre lens and post lens deflecting multipoles 20, 22 with opposite polarity (cf. FIG. 4d). As a result the beam is deflected but the illuminated probe spot 25 on the sample remains in its initial position. However, the deflected beam 27 is fully blanked by the blocking element (cf. dashed line in FIG. 4b), which leads to a beam intensity of zero at the spot 25 of the sample surface 24. Grey level exposure can also be obtained when only a part of the beam diameter is blanked by the blocking element (not shown).

FIG. 4c shows schematically a top view on the plane of an individual blanking element 29 such as a grid bar. As can be seen, the beam passes in the position 26 the edge of a grid bar 29 (or the rim of an aperture 28 indicated by the dotted line) and is therefore not blanked. When the beam is deflected to the position 27, however, it is blanked and no intensity reaches the sample surface. However, this modulation is achieved, without moving the spot 25 on the sample (see the dotted and dashed lines 26, 27 converging on the sample surface in FIG. 4b).

The described lens and deflection conjugate blanking system is preferably pre-adjusted with respect to the amplitudes of the blanking signals to keep the spot within 0.1 of the resolution of the system, e.g. 0.3 nm at a 3 nm probe diameter, and to be calibrated for the grey level exposure beam currents to be used.

The described fast multipole deflector and blanker allows specifically a beam induced deposition and etching employing very short dwell times of less than 1 μsec and ultimately as short as 0.1 nsec. This is of high importance for conducting nanostructurization and high throughput mask repair. In this context, it is noted that the multipole 22 is preferably integrated into a gas feeding assembly, which can be used to direct precursor or other reactive gases onto the sample surface 24 (as shown in FIG. 1). Such a design is advantageous, since it effectively uses the limited available space above the sample surface 24.

Another embodiment for an improved beam blanking unit realized by combining an objective lens of any type with a post lens deflection multipole element and a shielding element as described above is explained in FIG. 5a, which shows schematically the beam blanking ray path. The primary beam 88 is focused by the lenses 81, 82, 83 to the sample, and deflected inside the multipole 86 to hit the shielding element 823, and to be stopped there. In this situation the beam is "blanked". Due to the high speed of the deflection signal according to the present invention as described above, and due to the brightness of the electron gun in use, almost no electrons will hit the sample along the path of the beam from the focus spot to the blanking position on the grid bar 823.

FIG. 5b shows a top view of the shielding element with the scanning area and beam positions for sample exposure and beam stopping. In this figure, the shielding element 823 is in the form of a grating or grid providing a scanning area 88c. Further shown is the beam cross section 88b exposing the sample, and a possible beam location for beam blanking at a position 88a located on a grid bar.

The signals applied for blanking and subsequent scanning are finally schematically shown versus time in FIG. 5c.

FIGS. 6-10 illustrate a method according to a preferred embodiment of the invention and the significant advantages achieved thereby. As will be described below, one important aspect of the disclosed method is that the pixel dwell time can have very short values of less than 100 ns. This requires a high bandwidth of the system generating the deflection signals for the electron beam but was surprisingly found to be the decisive parameter for improving the accuracy and the throughput of a high resolution processing of a sample surface. This applies in particular, if a chromium layer is etched using a mixture of $XeF_2$ and $H_2O$.

In addition to the short pixel dwell times and an independent control of the dwell and the refresh times by the system, the ratio between the partial pressures of $XeF_2$ and $H_2O$ is important for etching chromium, in particular for optimizing the throughput of the process. The partial pressure of the water vapour has to be high enough to get a high process speed and low enough to achieve a mostly planar etch process. Preferably, the vapour pressure for both gases is controlled by cooling suitable reservoirs, wherein the $XeF_2$ is preferably kept at a temperature of 0° C. and the $H_2O$ is preferably kept at a temperature between −34° C. and −40° C.

FIG. 6a presents a schematic scan pattern 100 as it can be used to process an area 101 of a surface of a sample, for example to etch an excess of a chromium layer on a lithography mask with $XeF_2$ and $H_2O$. In this simplified example, the area 101 to be etched is essentially a quadrangle. The scan pattern 100 follows a serpentine, as indicated by the line on the quadrangle 101. It can be seen that a certain line step size 102 in Y-direction is used to avoid side effects, which might occur, if the electron dose of the back and forth scan of the serpentine 100 overlaps. Preferred values of the line step size 102 depend on the scan speed, wherein a fast scan preferably uses a higher line step size such as 17 pixels, wherein each pixel is defined by the cross section of the electron probe or charged particle probe formed on the sample surface and has a size of 2 nm. At a lower scan speed, the line step size may have a value of only 3 pixels. In this embodiment, the overall area 101 consists of 2048×2048 pixels and the magnification of the SEM is 10000. Exemplary scan parameters are a beam voltage of 1 kV and a beam current of 30-50 pA using an aperture of 20 μm.

In order to take effects caused by secondary electrons into account, the scan pattern 100 does preferably not cover the whole area 101 to be processed. This is illustrated by the limited size of the cross section of the electron or charged particle probe 103 shown in FIG. 6a, which, for example, does not fully move into the edges of the quadrangular area 101. In addition, an algorithm in the software unit or a similar device controlling the primary electron beam preferably assures that portions, which have already been sufficiently processed, are blanked during furthey scans. To this end, the secondary beam of electrons created by the primary beam can be "online" evaluated as a kind of feedback signal to decide, whether the current position of the primary beam is on a portion of the area 101, which has already been sufficiently processed, for example if the chromium layer is fully removed. As a result, unintended side-effects such as river-bedding are further reduced.

Figure 6C:
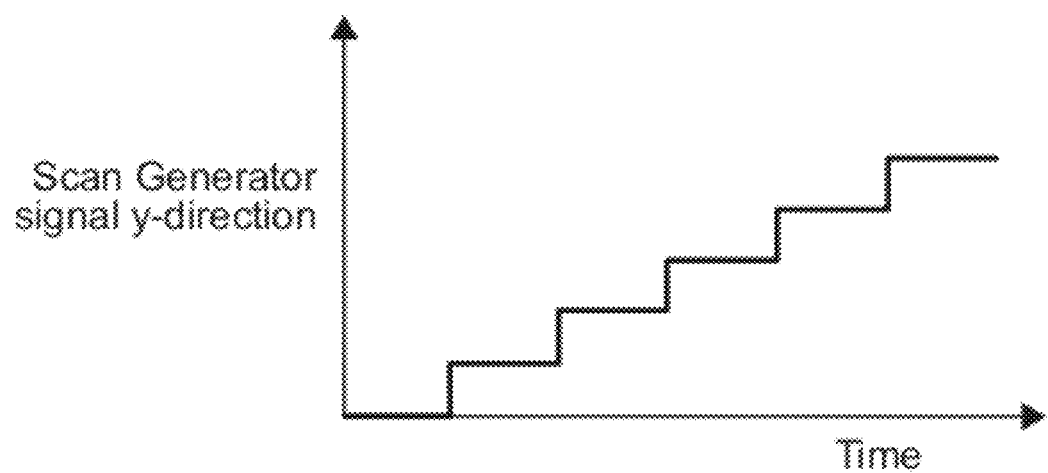

FIGS. 6b and 6c illustrate the signals necessary to achieve the serpentine pattern 100 shown in FIG. 6a. As can be seen, the signal for the beam deflection in x-direction is basically triangular, whereas the line steps in y-direction are created using a stepwise increasing signal.

Figure 7B:
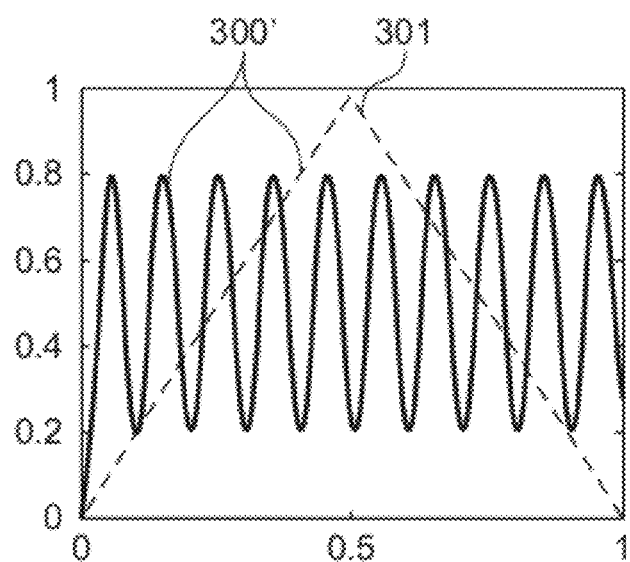

FIGS. 7a and 7b illustrate the effect of a low bandwidth of the overall system generating the deflection signal. FIG. 7a presents the situation for a system with a high bandwidth. As can be seen, the beam path 300 can correctly follow not only a slow but also a fast triangular deflection signal (continuous and dashed lines in FIG. 8a, respectively). However, if a system with a low bandwidth is used, as shown in FIG. 7b, the resulting beam path 300' will have a modified shape even for the slow deflection signal, namely a rounded curve at the single turning point 301 (cf. the topmost part of the dashed line in FIG. 7b). If a fast deflection signal is to be generated, the effect of the low bandwidth is even worse, since not only the shape but also the amplitude of the resulting beam path deflection is affected. Maximum deflections of 1 and 0 (arbitrary units) can no longer be achieved (cf. the continuous line in FIG. 7b).

FIGS. 8a-10b illustrate in an exemplary manner the consequences of a low bandwidth deflection system, which does not allow the above indicated short pixel dwell times, on the accuracy of the etched area. An excess defect of a chromium layer or a similar material on a lithography mask (or any other substrate) is shown in FIG. 8a and highlighted by the dashed rectangle. FIG. 8b illustrates the shape of the excess area 101 as derived from FIG. 8a.

If the excess area 101 is processed by a system with a low bandwidth, the dose distribution 200 will be as shown in FIG. 9a. A more detailed view is presented in FIG. 10a. As can be seen, the dose distribution 200 is far from being uniformly distributed and in particular smaller than the shape of the area 101. Further, there is an incorrect dose distribution 200 at the corners of the area 101 to be repaired.

Figure 10B:
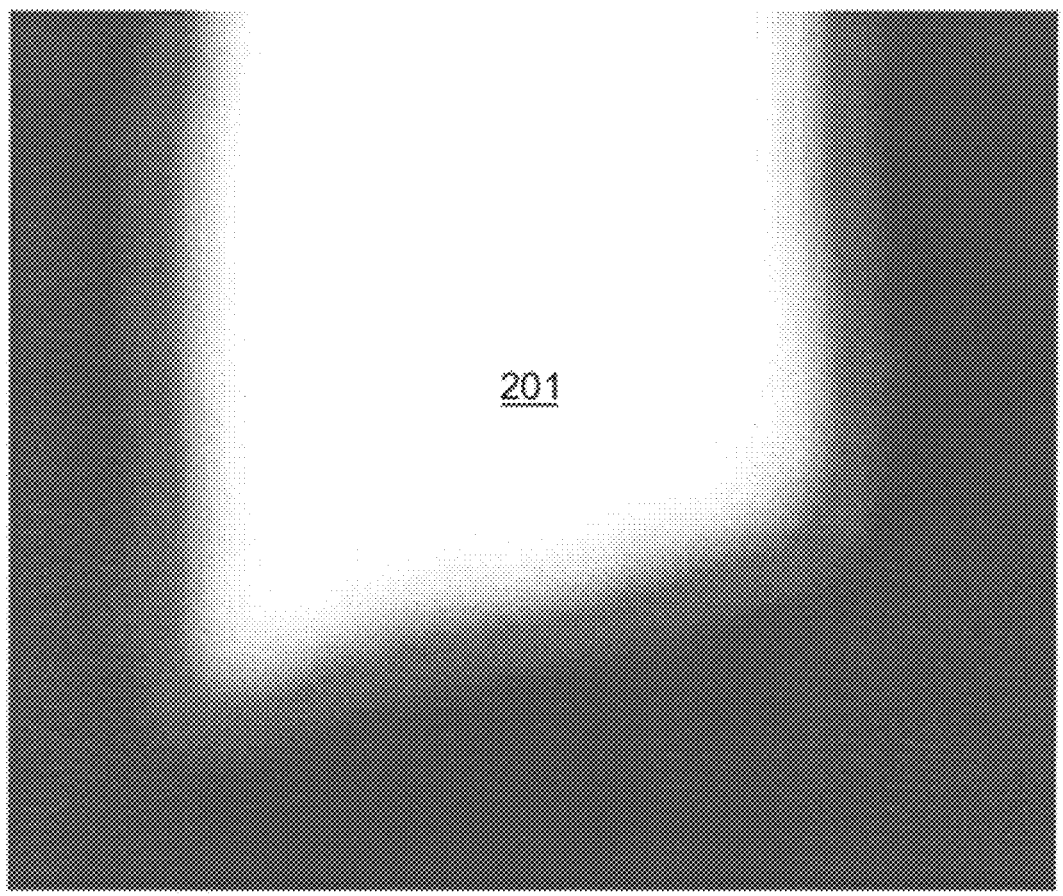

FIGS. 9b and 10b illustrate by contrast that a system with a high bandwidth will lead to a uniform dose distribution 201 and therefore to a uniform etching of the excess defect, wherein the edge sharpness is only limited by the effective beam diameter. Side effects such as river-bedding are to a large extent avoided.

It is apparent that the advantages of scanning with a high bandwidth, i.e. a small minimum pixel dwell time of 100 ns or less, can not only be applied for the above described etching process but also, if a material layer is to be deposited under the influence of a beam of charged particles such as an electron beam.

Whereas the invention has been described in the context of an apparatus having only a single beam of charged particles, it is also conceivable to use the present invention in multi-beam exposure systems (not shown), as they are increasingly under development for greater working speed (e.g. reduced wafer inspection time, or mask writing time) and direct write lithography for maskless lithography applications. In such an arrangement an insulating plate can be constructed to carry octopole deflection, focusing and stigmating elements in an array, wherein each of them is adjusted to a charged article beam system capable of structuring surfaces with beam induced reactions and also imaging and measuring the structures at the sample.

The invention claimed is:

1. An apparatus, comprising:
   a. a charged particle source configured to emit charged particles;
   b. at least one particle optical element configured to form a charged particle beam of charged particles emitted by the charged particle source;
   c. an objective lens configured to generate a charged particle probe from the charged particle beam, the objective lens defining a particle optical axis;
   d. a first electrostatic deflection element arranged—in a direction of propagation of charged particles emitted by the charged particle source—downstream of the objective lens, the first electrostatic deflection element configured to deflect the charged particle beam in a direction perpendicular to the charged particle optical axis; and
   e. an electrically conductive shielding element with an opening configured so that the charged particle beam can pass through the opening, the electrically conductive shielding element being arranged—in the direction of propagation of charged particles emitted by the charged particle source—downstream of the first electrostatic deflection element.

2. The apparatus of claim 1, wherein the first electrostatic deflection element comprises electrodes having a capacity with respect to each other and with respect further components of the apparatus adjacent to the electrodes of less than 50 pF.

3. The apparatus of claim 2, wherein the objective lens has a source side directed to the charged particle source and a probe side opposite to the source side, and wherein the objective lens comprises an electrostatic immersion lens configured to reduce a kinetic energy of charged particles when passing through the objective lens from the source side to the probe side to a kinetic end energy of less than or equal to 5 keV.

4. The apparatus of claim 3, wherein the objective lens further comprises a magnetic lens.

5. The apparatus of claim 1, further comprising a gas feeding system with one or more tubes, each of the one or more tubes having a terminating end, wherein the terminating end of each of the one or more tubes is positioned between the objective lens and the electrically conductive shielding element.

6. The apparatus of claim 5, wherein the gas feeding system is designed to feed a reaction gas that is capable of causing a chemical reaction with a sample in the apparatus after excitation by the charged particle beam.

7. The apparatus of claim 6, further comprising a control system configured to control the gas feeding system and the first electrostatic deflection element so that, after a reaction gas is supplied to the sample, the sample can be scanned at specified positions by the charged particle beam.

8. The apparatus of claim 1, wherein the apparatus is configured so that the sample is scanned by the charged particle beam so that a position at which the charged particle beam impinges on the sample is kept constant for a selectable dwell time and thereafter is scanned to another position on the sample within a time period of less than 100 ns.

9. The apparatus according to claim 1, wherein a distance $d_1$ between the first electrostatic deflection element and the electrically conductive shielding element is in the range of 10 µm<$d_1$<2.5 mm.

10. The apparatus according to claim 1, wherein the opening of the electrically conductive shielding element has a linear opening dimension of less than 100 µm.

11. The apparatus according to claim 1, wherein a distance $d_2$ between the electrically conductive shielding element and a probe plane in which the probe is generated by the objective lens is less than 50 µm.

12. The apparatus according to claim 1, wherein the first electrostatic deflection element has an inner opening of a size not to obstruct the charged particle beam in a field of view with a diameter of $d_3$<100 µm.

13. The apparatus according to claim 1, wherein the first electrostatic deflection element has an inner opening with a diameter $d_4$ in a range of 0.05 mm<$d_4$<5 mm.

14. The apparatus according to claim 1, wherein the first electrostatic deflection element comprises a plurality of electrodes separated by slits having a width w of 50 µm<w<3 mm.

15. The apparatus according to claim 1, further comprising a second electrostatic deflection element arranged on a source side of the objective lens.

16. The apparatus according to claim 15, further comprising a deflection control configured to control deflection voltages applied to the first and the second electrostatic deflection elements so that the beam of charged particles is angularly deflected while a position of the charged particle probe in a probe plane, in which the probe is generated by the objective lens, is maintained fixed.

17. The apparatus according to claim 1, further comprising a blocking element arranged between the first deflection element and a surface of a sample, the blocking element being configured to at least partly block the beam of charged particles when the beam of charged particles is deflected.

18. The apparatus according to claim 1, wherein the first electrostatic deflection is selected from the group consisting of a dipole, a quadrupole, a hexapole, an octopole and a decapole.

19. A method comprising:
   a. directing a primary beam of charged particles onto a surface of a sample, the primary beam of charged particles passing through, in relative order, an objective lens, an electrostatic deflection element and an electrically conductive shielding element before reaching the surface of the sample; and
   b. deflecting the primary beam of charged particles with the electrostatic deflection element onto a plurality of positions on the surface of the sample with a minimum dwell time of 100 nanoseconds or less at each of the positions on the surface of the sample.

20. The apparatus of claim 1, wherein the first electrostatic deflection element has a deflection bandwidth of at least 10 MHz.

* * * * *

UNITED STATES PATENT AND TRADEMARK OFFICE
CERTIFICATE OF CORRECTION

PATENT NO.        : 8,247,782 B2
APPLICATION NO.   : 12/745059
DATED             : August 21, 2012
INVENTOR(S)       : Klaus Edinger It is certified that error appears in the above-identified patent and that said Letters Patent is hereby corrected as shown below:

Column 5,
Line 34, delete "defleeted" and insert --deflected--

Column 9,
Line 52, delete "electrans" and insert --electrons--

Column 10,
Line 15, delete "aequipotentials" and insert --equipotentials--

Column 13,
Line 63, delete "furthey" and insert --further--

Column 16,
Line 4, delete "$d_1$between" and insert --$d_1$ between--

Signed and Sealed this
Thirteenth Day of November, 2012

David J. Kappos
*Director of the United States Patent and Trademark Office*